United States Patent

Fukami et al.

[11] Patent Number: 6,060,396
[45] Date of Patent: May 9, 2000

[54] POLISHING AGENT USED FOR POLISHING SEMICONDUCTOR SILICON WAFERS AND POLISHING METHOD USING THE SAME

[75] Inventors: Teruaki Fukami; Tsutomu Takaku, both of Fukushima-ken, Japan

[73] Assignee: Shin-Etsu Handotai Co., Ltd., Tokyo, Japan

[21] Appl. No.: 09/209,483

[22] Filed: Dec. 11, 1998

[30] Foreign Application Priority Data

Dec. 17, 1997 [JP] Japan .................................. 9-347898

[51] Int. Cl.$^7$ ............................................. H01L 21/00
[52] U.S. Cl. ........................... 438/693; 216/89; 252/79.5; 438/745; 438/753
[58] Field of Search .................. 252/79.1, 79.5; 216/38, 88, 89; 438/691, 692, 693, 745, 747, 753; 106/3

[56] References Cited

U.S. PATENT DOCUMENTS

| | | |
|---|---|---|
| 3,951,710 | 4/1976 | Basi ............................... 252/79.1 X |
| 5,230,833 | 7/1993 | Romberger et al. . |
| 5,885,334 | 3/1999 | Suzuki et al. ........................ 438/693 X |

*Primary Examiner*—William Powell
*Attorney, Agent, or Firm*—Arent Fox Kintner Plotkin & Kahn PLLC

[57] ABSTRACT

A semiconductor silicon wafer polishing agent and a polishing method using the same are provided for avoiding the need for an increased purity of a polishing agent which may cause a prohibitively high cost, while still preventing semiconductor wafers from being contaminated by metals, particularly by copper and nickel, in a polishing process. The semiconductor silicon wafer polishing agent comprises a silica containing polishing agent as a main component, and Cu and Ni respectively in concentration of 0.01 to 1 ppb with respect to the total amount of the polishing agent.

4 Claims, 2 Drawing Sheets

POLISHING AGENT USED FOR POLISHING SEMICONDUCTOR SILICON WAFERS AND POLISHING METHOD USING THE SAME

BACKGROUND OF THE INVENTION

1. Field of the Invention

The present invention relates to a polishing agent and a polishing method used for polishing semiconductor silicon wafers (hereinafter may be simply referred to as wafer, semiconductor wafer or silicon wafer), which can effectively prevent metal contamination, particularly Cu and Ni contamination of semiconductor silicon wafers in a polishing process.

2. Description of the Related Art

Generally, a method of manufacturing semiconductor wafers includes a slicing process for obtaining wafers of thin disc shape by slicing a single crystal ingot; a chamfering process for chamfering a peripheral edge portion of each wafer produced by the slicing process in order to prevent cracking or breakage of the wafer; a lapping process for flattening the surface of each chamfered wafer; an etching process for removing mechanical damages remaining on the chamfered and lapped wafers; a mirror polishing process for mirror polishing the surfaces of the etched wafers; and a cleaning process for cleaning the polished wafers to remove the polishing agent and foreign substances attached thereon.

The polishing process generally uses a silica containing polishing agent which has fine $SiO_2$ particles colloidally dispersed in an alkaline solution having a pH value approximately in a range of 9 to 12, wherein wafers are polished by a combination of a mechanical action of $SiO_2$ and a chemical action of the alkaline solution which chemically etches the silicon wafers.

The alkaline silica containing polishing agent, however, includes metal impurities. Such metal impurities included in the silica containing polishing agent may be nickel, chrome, iron, copper and so on.

Such metal impurities are included in the silica containing polishing agent because natural quartz is used as a raw material for $SiO_2$. To increase the purity of the silica containing polishing agent, synthetic quartz is generally used instead as a raw material therefor, however, this disadvantageously increases the cost as compared with natural quartz.

Thus, measures have been taken to increase the purity of the silica containing polishing agent using a cation exchanger resin in course of manufacturing $SiO_2$ from natural quartz. The use of the cation exchanger resin enables $SiO_2$ to be manufactured at a lower cost than using synthetic quartz and in a purity higher than $SiO_2$ directly manufactured from natural quartz.

It has been revealed however that contamination may occur seemingly due to copper and/or nickel even using a silica containing polishing agent using $SiO_2$ manufactured as mentioned above.

In a continuous consideration made by the present inventors on the polishing of semiconductor silicon wafers using a silica containing polishing agent including such metal impurities, it has been revealed that metals existing in the silica containing polishing agent, particularly, copper and nickel deeply diffuse into wafers during a polishing process to deteriorate the quality of wafers and significantly degrade the characteristics of semiconductor devices subsequently formed using the wafers. However, it has been also revealed that heavy metals other than copper and nickel can be removed by cleaning the wafers after polishing so that they are not critical contaminants within wafers.

Stated another way, it has been revealed that while the concentrations of copper and nickel must be reduced as low as possible, the foregoing processing using only the cation exchanger resin is not sufficient, and other measures must be taken for increasing the purity of the polishing agent. However, measures taken for further increasing the purity cause a problem that an increase in the manufacturing cost of the silica containing polishing agent is necessarily associated therewith.

The present inventors in view of the problems inherent to the foregoing prior art, thought it necessary to clarify the concentrations of copper and nickel allowable in a silica containing polishing agent and found, as a result of diligently studying the relationship between the concentrations of heavy metals in the silica containing polishing agent and metal contamination during a polishing process, that wafers can be prevented from being contaminated by copper and nickel if they are polished in a controlled manner such that the concentrations of heavy metals, particularly copper and nickel, in the silica containing polishing agent are reduced to 1 ppb or less, and that the metal contamination can be more effectively prevented by polishing wafers while maintaining the pH value of the silica containing polishing agent at or below 11, thus reaching the present invention.

OBJECT AND SUMMARY OF THE INVENTION

It is therefore an object of the present invention to provide a polishing agent for semiconductor silicon wafers and a method of polishing semiconductor silicon wafers using the polishing agent which avoid the need for an increased purity of the polishing agent which may result in a prohibitively high cost, and still prevent semiconductor wafers from being contaminated by metals, particularly by copper and nickel, in a polishing process.

To solve the above problem, a semiconductor silicon wafer polishing agent of the present invention is characterized by having a silica containing polishing agent as a main component and Cu and Ni respectively in concentration ranging from 0.01 to 1 ppb with respect to the total amount of the polishing agent. Specifically, the Cu concentration and the Ni concentration may be controlled to be in a range of 0.01 to 1 ppb, respectively, with respect to the total amount of polishing agent stored in a polishing agent supply tank. While Cu, Ni are preferably not present, their concentrations of 0.01 ppb or more are sufficiently acceptable in view of the manufacturing cost. As the silica containing polishing agent, a colloidal silica polishing agent may be used.

In the method of polishing semiconductor silicon wafer according to the present invention, the foregoing semiconductor silicon wafer polishing agent is used, and semiconductor silicon wafers are preferably polished while maintaining the pH value of the polishing agent in a range of 10 to 11. The polishing agent having the pH value below 10 causes a significant reduction in polishing speed, which is not preferable in view of the productivity.

The method of the present invention employs a silica containing polishing agent containing copper and nickel in concentration ranging from 0.01 to 1 ppb, respectively, and preferably having the pH value in a range of 10 to 11, thereby making it possible to suppress semiconductor silicon wafers contaminated by copper and nickel in a polishing process.

As will be apparent from Experimental Example 1, later described, and FIG. 2 illustrating the result of Experimental Example 1, wafers are more susceptible to contamination by copper and nickel as the pH value of the polishing agent is higher.

As is apparent from FIG. 2, it is revealed that wafers are more readily contaminated as the polishing agent has a higher pH value. It is also revealed that the contamination is significantly reduced if the concentrations of copper and nickel are reduced to 1 ppb or less. However, even with the concentrations of copper and nickel being equal to or less than 1 ppb, wafers are more susceptible to contamination if the polishing agent has the pH value more than 11. On the other hand, since the polishing speed is significantly reduced when the polishing agent has the pH value less than 10, the pH value is preferably higher. In view of these aspects, the polishing process is most preferably conducted using a polishing agent having the pH value in a range of 10 to 11.

Since it has been so far believed that heavy metals included in a polishing agent can be removed in a subsequent cleaning process, they have not been controlled as a critical factor. Actually, some polishing agents available on the market may include copper and nickel respectively in concentration of approximately 30 to 50 ppb.

The present invention controls the concentrations of copper and nickel in a polishing agent in such a manner that wafers are polished with the polishing agent having the concentrations in a range of 0.01 to 1 ppb and the pH value in a range of 10 to 11. In this event, any method may be applied for adjusting the concentrations of copper and nickel in the polishing agent as long as it can adjust the concentrations, and no particular limitations are imposed thereon.

For example, methods applicable for adjusting the concentrations of copper and nickel may include a method of diluting a silica containing polishing agent available on the market with pure water including no metal or the like in a polishing material supply tank to control the concentrations of copper and nickel in a range of 0.01 to 1 ppb, a method of repeating a conventional purifying process using a cation exchanger resin a plurality of times to increase the purity of a polishing agent to have the concentrations of copper and nickel in a range of 0.01 to 1 ppb, and so on.

It should be noted that a further increased purity is not required once the concentrations of copper and nickel have fallen into the range of 0.01 to 1 ppb since such high purity would require excessive works and result in a prohibitively high cost. By the use of the polishing agent controlled as described above, wafers are prevented from being contaminated by metals.

DESCRIPTION OF THE PREFERRED EMBODIMENTS

The present invention will hereinafter be described in greater detail by way of the following examples which should be construed is illustrative rather than restrictive.

Figure 3:
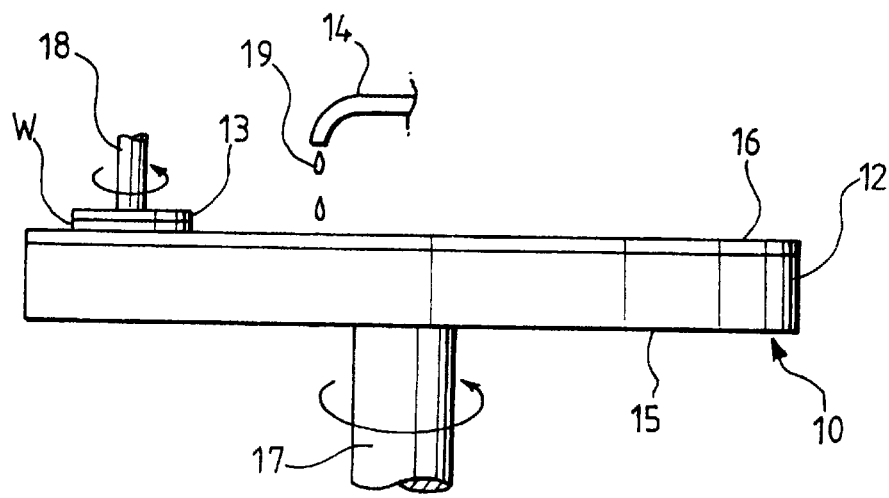
FIG. 3 is a side elevation of a polishing apparatus used in Example 1, Comparative Examples 1–3 and Experimental Example 1.

FIG. 3 is a side elevation of a polishing apparatus which is used in Example 1 and Comparative Examples 1–3. Referring specifically to FIG. 3, the polishing apparatus 10 comprises a polishing turn-table 12, a wafer holder 13, and a polishing agent supply member 14. The polishing turn-table 12 comprises a turntable 15 and a polishing pad 16 adhered on the upper surface thereof. The polishing turn-table 12 is rotated through a rotating shaft 17 at a predetermined rotational speed. The wafer holder 13 holds a wafer W on its bottom surface through vacuum adsorption or the like, and presses the wafer W against the polishing pad 16 with a predetermined load while it is simultaneously rotated through the rotating shaft 18. The polishing agent supply member 14 supplies a polishing agent 19 onto the polishing pad 16 at a predetermined flow rate from a polishing agent supply tank (not shown), so that the wafer W is polished with the polishing agent 19 supplied between the wafer W and the polishing pad 16.

EXAMPLE 1 AND COMPARATIVE EXAMPLES 1–3

(Relationship between Concentrations of Copper and Nickel in Polishing Agent and Wafer Contamination Level)

Sample Wafer: Czochralski-grown p-type<100>-oriented, 150 mm diameter, single crystal silicon wafer Polishing Pad: Unwoven fabric (velour-type), hardness=70 (Asker C-scale, JIS K-6301)

Polishing Agent: A colloidal silica stock solution containing 2 wt % of $SiO_2$, having metal impurities removed therefrom by a cation exchanger resin was diluted 10 times with pure water to produce a diluted colloidal silica polishing agent, and the resulting polishing agent was used. The Cu and Ni concentrations in this polishing agent were approximately 0.01 ppb or less, respectively.

Polishing Load: 350 g/cm$^2$

Polishing Time: 10 minutes

Under the polishing condition specified above, a standard solution of copper or nickel was added to the diluted colloidal silica polishing agent to prepare diluted polishing agents including copper or nickel in concentration of 1 ppb (Example 1), 10 ppb (Comparative Example 1), 100 ppb (Comparative Example 2), and 500 ppb (Comparative Example 3). Aqueous sodium hydroxide was added to these polishing agents to adjust the pH value equal to 11. Then, sample wafers were polished with these diluted polishing agents (two wafers per polishing agent) using the polishing apparatus illustrated in FIG. 3. Since a very few amount of aqueous sodium hydroxide was added for pH conditioning, the Cu and Ni concentrations were substantially identical to those of the polishing agent in the supply tank.

The polished sample wafers were evaluated in the following manner. For collecting Ni and Cu diffused over each wafer on the surface of the wafer, the polished surface of each polished sample wafer was subjected to sand-blast processing, cleaned and thermally treated for 30 minutes at 450° C. Subsequently, a thermal oxide film on the polished surface was vapor phase decomposed with a fluoric acid vapor, recovered with fluoric acid droplets, and analyzed by an ICP-MS (Inductively Coupled Plasma—Mass Spectrometry) method. A contamination level over the entire wafer was evaluated by the evaluating method as mentioned.

Figure 1:
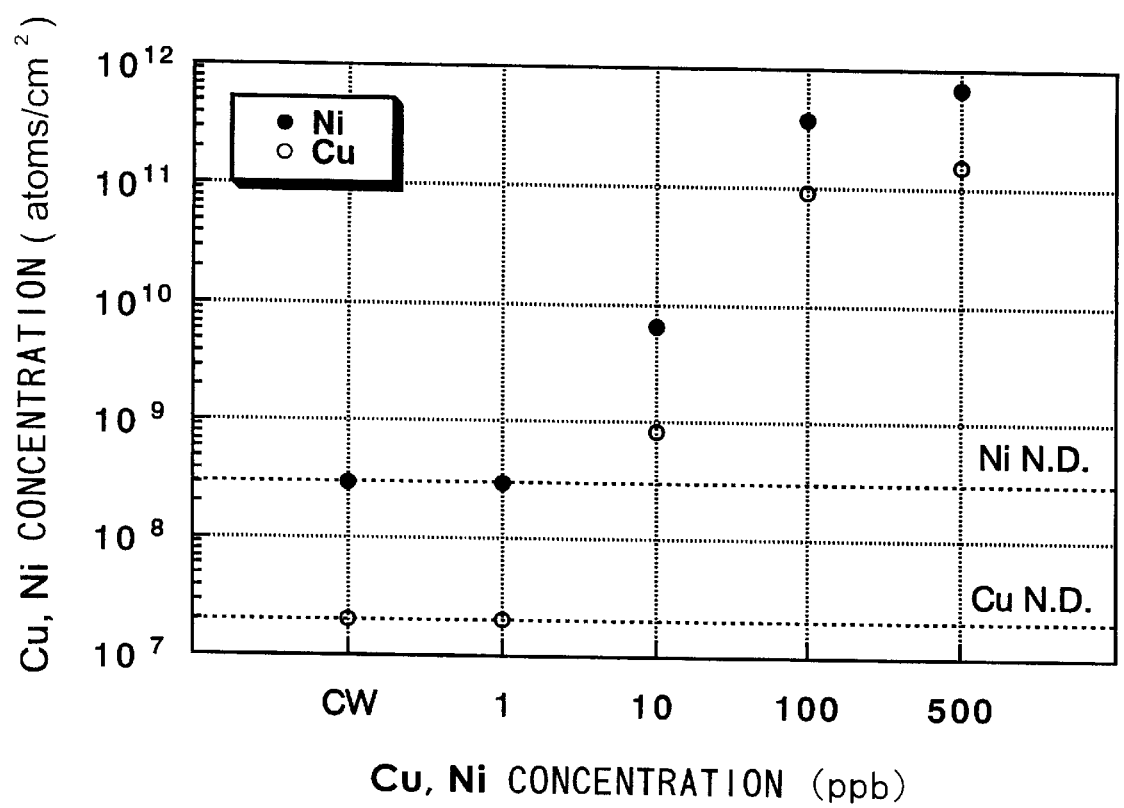
FIG. 1 is a graph showing copper and nickel concentrations in a polishing agent illustrated in Example 1, and copper and nickel contamination levels of sample wafers polished by this polishing agent.

The results are shown in FIG. 1. As is apparent from FIG. 1, it can be seen that copper and nickel contamination levels in the polished wafers are suppressed to an etched wafer level (indicated by CW in FIG. 1) by reducing the concentrations of copper and nickel in the colloidal silica polishing agent to 1 ppb or less. The etched wafer refers to a sample which is not polished, i.e., a reference sample which does not suffer from contamination by polishing, and indicates the levels of copper and nickel originally included in the wafer (in FIG. 1, N.D. represents a lower detection limit).

EXPERIMENTAL EXAMPLE 1
(Relationship between pH Value of Polishing Agent and Wafer Contamination Level)

Under a polishing condition similar to that of Example 1, copper and nickel standard solutions were added to the diluted colloidal silica polishing agent to prepare diluted polishing agents including 100 ppb and 300 ppb of copper and nickel, respectively. Aqueous sodium hydroxide was added to these polishing agents to change their pH values from 10.5 to 12.5. Then, sample wafers were polished with these diluted polishing agents using the polishing apparatus illustrated in FIG. 3 (two wafers per polishing agent).

Figure 2:
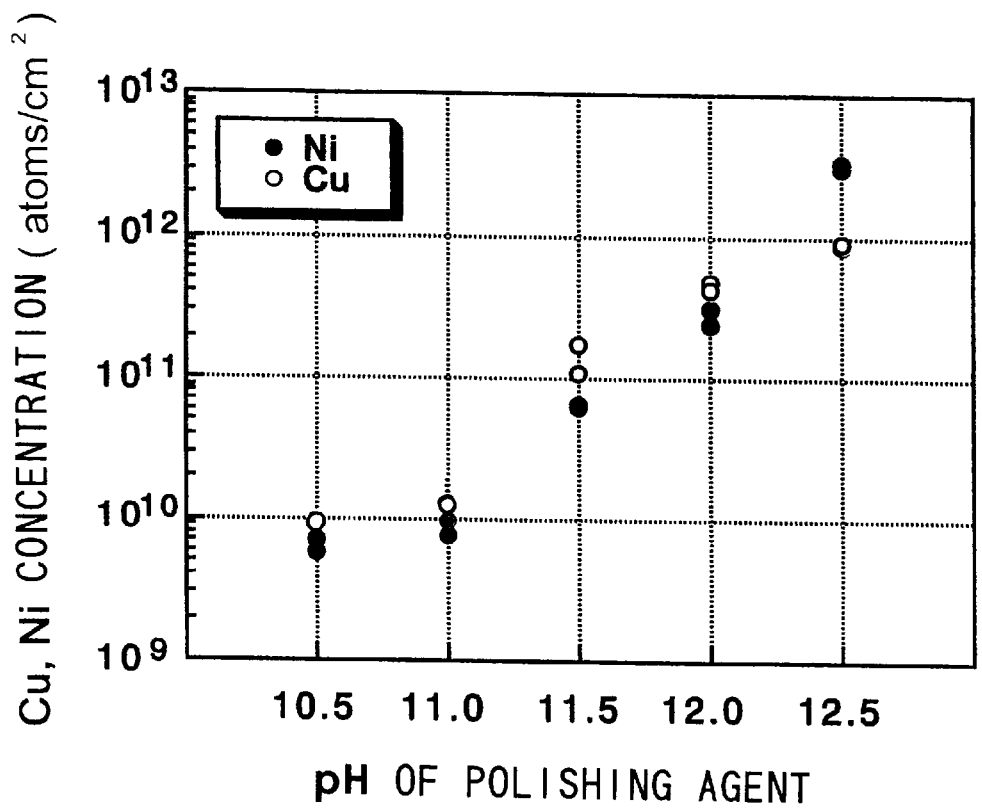
FIG. 2 is a graph showing the pH value of the polishing agent illustrated in Example 1 and copper and nickel contamination levels in polished sample wafers.

The results are shown in FIG. 2. It can be seen that the higher a pH value of the diluted polishing agent increases, the higher the copper or nickel contamination level becomes. It is therefore necessary to limit the pH value of the polishing agent to 11 or less since a pH value of the polishing agent exceeding 11 is more likely to cause copper or nickel contamination even if the concentration of copper or nickel in the polishing agent is equal to or less than 1 ppb.

As described above, the present invention can effectively suppress contamination of wafer by metal ions, particularly by copper and nickel, in a wafer polishing process.

Obviously, various minor changes and modifications of the present invention are possible in the light of the above teaching. It is therefore to be understood that within the scope of the appended claims the invention may be practiced otherwise than as specifically described.

What is claimed is:

1. A semiconductor silicon wafer polishing agent comprising a silica containing polishing agent as a main component, and Cu and Ni respectively in concentration of 0.01 to 1 ppb with respect to a total amount of the polishing agent.

2. A semiconductor silicon wafer polishing agent according to claim 1, wherein said silica containing polishing agent is a colloidal silica polishing agent.

3. A method of polishing a semiconductor silicon wafer comprising the steps of:

preparing a semiconductor silicon wafer polishing agent comprising a silica containing polishing agent as a main component, and Cu and Ni respectively in concentration of 0.01 to 1 ppb with respect to a total amount of the polishing agent; and polishing a semiconductor wafer while maintaining the pH value of said polishing agent between 10 and 11.

4. A method according to claim 3, wherein said silica containing polishing agent is a colloidal silica polishing agent.

* * * * *